(12) United States Patent
Kim

(10) Patent No.: US 7,358,110 B2
(45) Date of Patent: Apr. 15, 2008

(54) IMAGE SENSOR HAVING INNER LENS

(75) Inventor: Sang Sik Kim, Suwon (KR)

(73) Assignee: Dongbu Electronics Co., Ltd, Seoul (KR)

( * ) Notice: Subject to any disclaimer, the term of this patent is extended or adjusted under 35 U.S.C. 154(b) by 58 days.

(21) Appl. No.: 11/319,491

(22) Filed: Dec. 29, 2005

(65) Prior Publication Data

US 2006/0146415 A1    Jul. 6, 2006

(30) Foreign Application Priority Data

Dec. 30, 2004    (KR) ............... 10-2004-0116512

(51) Int. Cl.
    *H01L 21/00*    (2006.01)
    *H01L 21/44*    (2006.01)
(52) U.S. Cl. .................. 438/69; 438/70; 438/610; 257/E21.222
(58) Field of Classification Search ............. 438/69, 438/70, 706; 257/E21.222
    See application file for complete search history.

(56) References Cited

U.S. PATENT DOCUMENTS 6,372,558 B1 *    4/2002    Yamanaka et al. .......... 438/149

6,489,227 B1 *    12/2002    Hsieh et al. ................ 438/601
6,858,898 B1 *    2/2005    Hayakawa et al. ......... 257/347
6,903,395 B2 *    6/2005    Nakai et al. ................ 257/294

FOREIGN PATENT DOCUMENTS

KR    10-2002-0042098    6/2002
KR    10-2004-0008911    1/2004

* cited by examiner

*Primary Examiner*—Scott B. Geyer
*Assistant Examiner*—Seahvosh Nikmanesh
(74) *Attorney, Agent, or Firm*—McKenna Long & Aldridge LLP

(57) ABSTRACT

An image sensor includes an inner lens to enable incident light to reach a condensing lens, so that the incident light may further reach photodiodes. Light loss can be reduced and photosensitivity can be improved. The image sensor includes at least one microlens that focuses incident light onto at least one photosensor that receives a light signal transmitted from the at least one microlens. The image sensor also includes at least one inner lens, disposed between the at least one microlens and the at least one photosensor, having an upper surface of a predetermined curvature to compensate photosensitivity of light received from the at least one microlens.

12 Claims, 5 Drawing Sheets

IMAGE SENSOR HAVING INNER LENS

This application claims the benefit of Korean Patent Application No. 10-2004-0116512, filed on Dec. 30, 2004, which is hereby incorporated by reference for all purposes as if fully set forth herein.

BACKGROUND OF THE INVENTION

1. Field of the Invention

The present invention relates to an image sensor. More particularly, the present invention relates to an image sensor having an inner lens formed in a color filter portion to enable incident light to reach a condensing lens, so that the incident light may further reach photodiodes. Thus, light loss can be reduced and photosensitivity can be improved.

2. Discussion of the Related Art

An image sensor is a semiconductor module that converts optical images to electrical signals. Image sensors may be charge-coupled devices (CCD) or complementary-metal-oxide-semiconductor (CMOS) image sensors. Such image sensors employ photodiodes to detect a light signal, and resolution is determined by the number of photodiodes existing in an image plane. The photodiodes receive images. Each photodiode represents a key element of one pixel unit, which includes a corresponding color filter of a color filter array and a corresponding microlens, all of which may be integrated on a single chip. With the demand for increased resolution along with greater miniaturization, more pixels are needed per unit area, which requires a decrease in pixel size. As a result, a photodiode area is reduced accordingly, thereby reducing photosensitivity.

To compensate photosensitivity, an inner lens may be additionally formed. The inner lens enables incident light to adapt to variations of a condensing angle due to an F-number. The inner lens also compensates for stray light that occurs due to the long travel distance to the photodiode area. The inner lens may be formed of an organic material or an inorganic material. If the inner lens is formed of an organic material, a positive photoresist having fluidity is used. Therefore, the process of forming the inner lens of an organic material is the same as the process of forming a condensing lens formed on a color filter portion. That is, the inner lens may be also formed by coating, exposure, development, bleaching, curing, and planarizing the color filter portion.

If a photoresist having fluidity is used, a problem in controlling critical dimension due to notching occurs. The notching occurs as the photoresist is affected by a light-shielding metal layer to be coated with the photoresist. For this reason, problems occur in that the process of forming the inner lens is complicated and an additional interlayer process is required.

SUMMARY OF THE INVENTION

Accordingly, the present invention is directed to an image sensor having an inner lens that substantially obviates one or more problems due to limitations and disadvantages of the related art.

An advantage of the present invention is to provide an image sensor having an inner lens, in which the inner lens is formed in a color filter portion to enable incident light to reach a condensing lens, so that the incident light may further reach photodiodes. Thus, light loss can be reduced and photosensitivity can be improved.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, an image sensor includes at least one microlens that focuses incident light onto at least one photosensor that receives a light signal transmitted from the at least one microlens, and at least one inner lens, disposed between the at least one microlens and the at least one photosensor, having an upper surface of a predetermined curvature to compensate photosensitivity of light received from the at least one microlens.

According to another aspect of the present invention, a method for fabricating an image sensor includes forming a photoresist layer on a planarization layer, performing an alignment exposure with respect to the photoresist layer, performing a dry etching process with respect to the exposed photoresist layer, and forming an oxide layer on the etched photoresist layer by silation using a silane gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1:
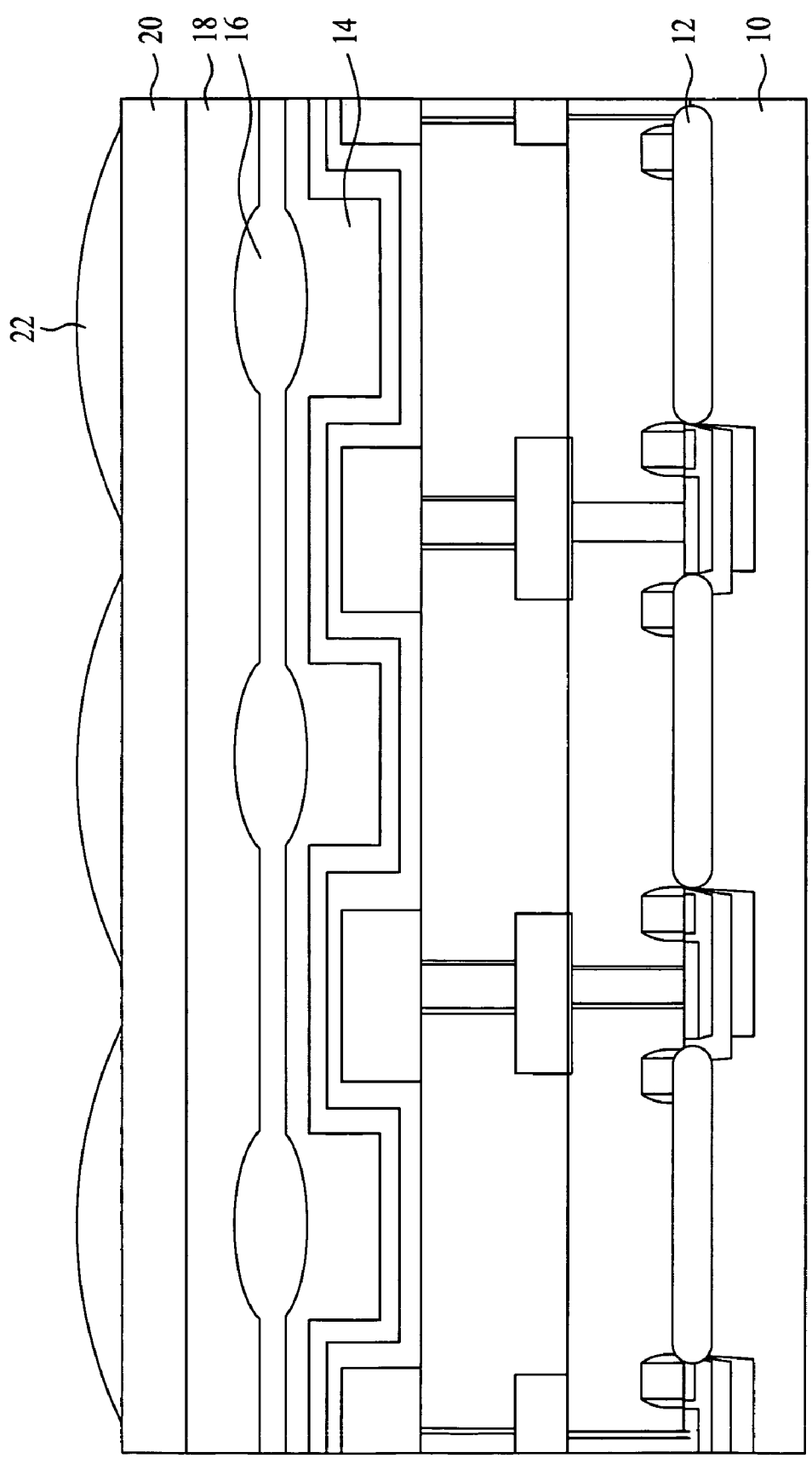
FIG. 1 is a cross-sectional view of a vertical structure of an image sensor according to the present invention.

Referring to FIG. 1, the image sensor according to the present invention includes a silicon wafer or substrate 10, a plurality of photosensors such as photodiodes 12, a planarization layer 14, which may have a recessed surface, a plurality of inner lenses 16, which includes an oxide layer, formed on the planarization layer 14 to correspond to each photodiode 12, a color filter layer 18, an overcoating layer 20 formed on the color filter layer 18, and a microlens 22 formed on the overcoating layer 20 to correspond to each inner lens 16.

Figure 2:
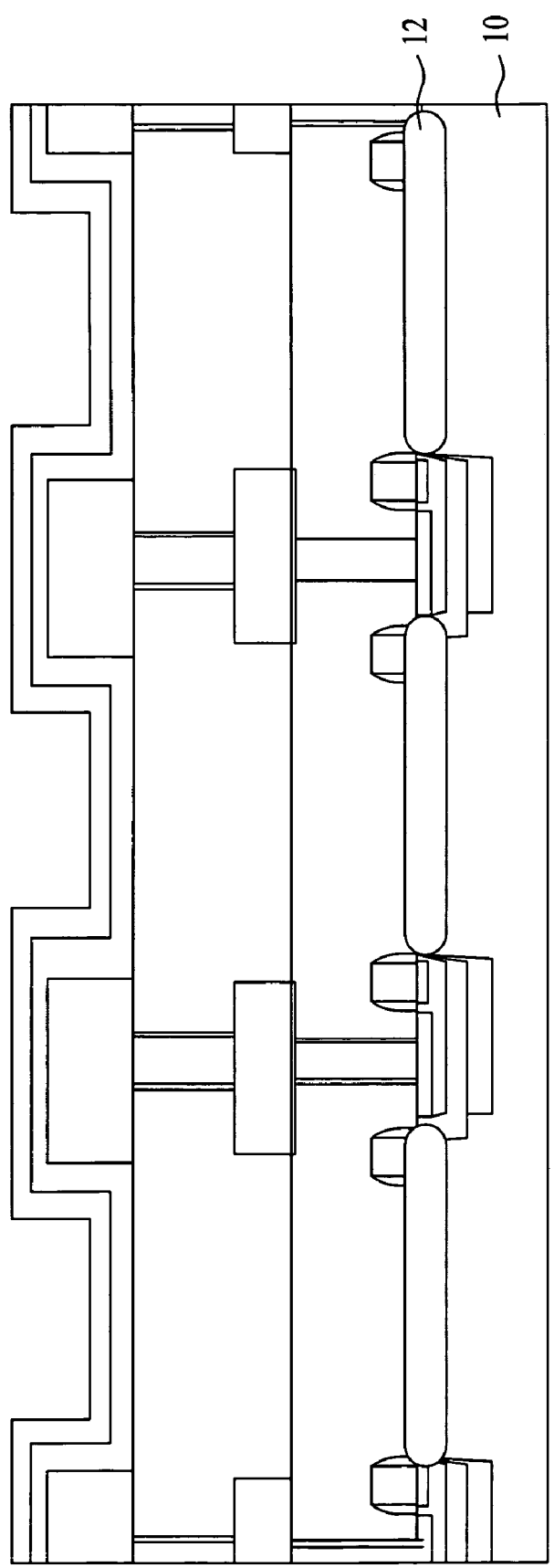
FIG. 2 is a cross-sectional view of a black-and-white image sensor.
Figure 3:
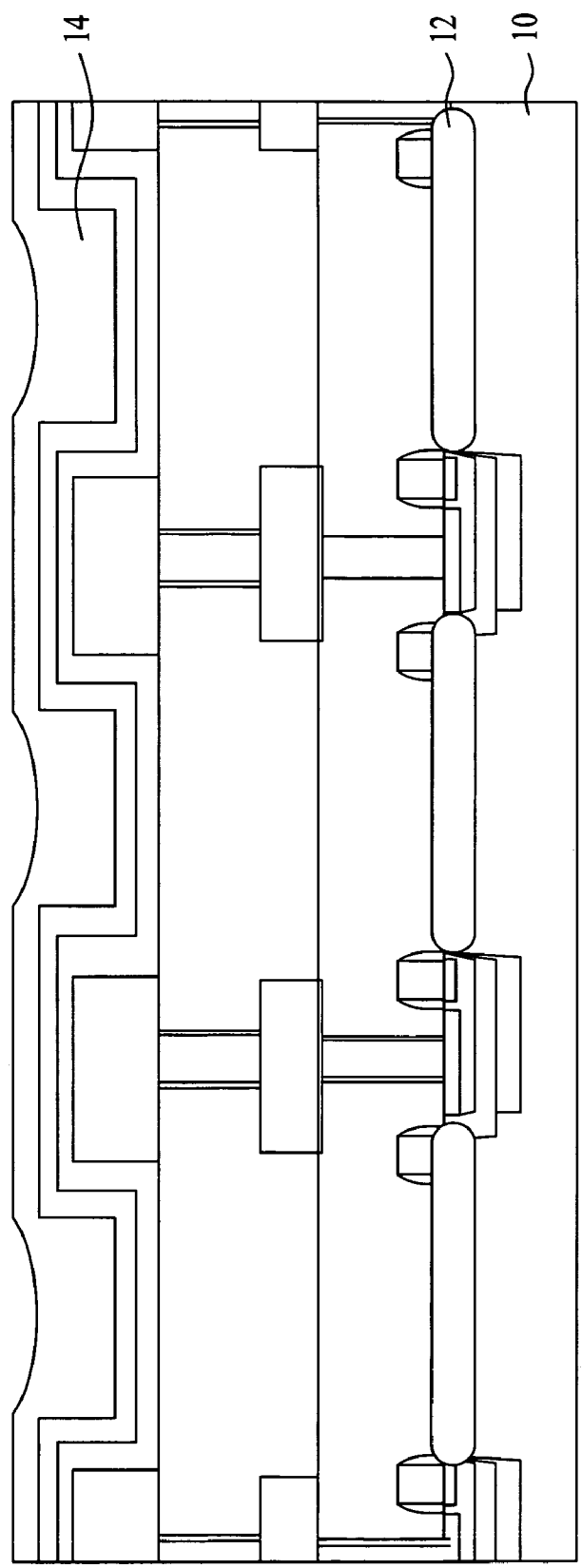
FIG. 3 is a cross-sectional view of the image sensor of FIG. 2, including a planarization layer according to the present invention.

Referring to FIG. 2, general CCD- or CMOS-type process steps are employed to form a black-and-white structure of the image sensor on a silicon wafer 10 including a plurality of photodiodes 12. As shown in FIG. 3, a planarization layer 14 is formed of an organic material exhibiting good transmissivity characteristics for visible light wavelengths. The planarization layer 14 is a passivation layer that serves to improve the profile of the underlying structure and to provide greater surface uniformity for an upper portion of the image sensor. The upper surface of the planarization layer 14 may have a plurality of recesses corresponding to the photodiodes 12.

Figure 4:
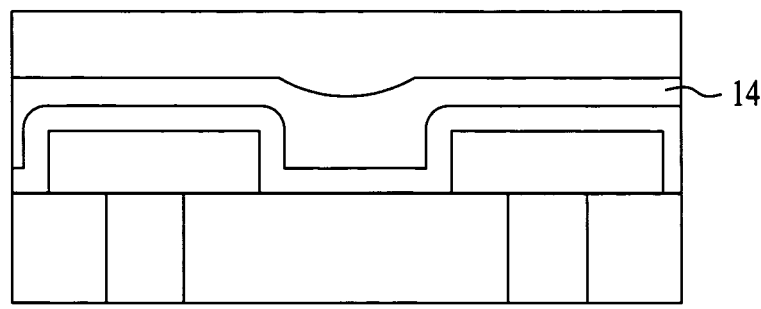
FIGS. 4-9 are cross-sectional views of an image sensor according to the present invention, and respectively illustrate sequential process steps used in forming the image sensor.

Referring to FIG. 4, the planarization layer 14 is coated with a photoresist having a fluidity. The thickness of the coated photoresist determines inner lens formation. That is, the thickness of the photoresist layer depends on the desired pixel size and the thickness of the underlying layer, i.e., the planarization layer 14. In an embodiment of the present invention, the photoresist is coated to a thickness of approximately 0.5 to 1.5 µm.

Figure 5:
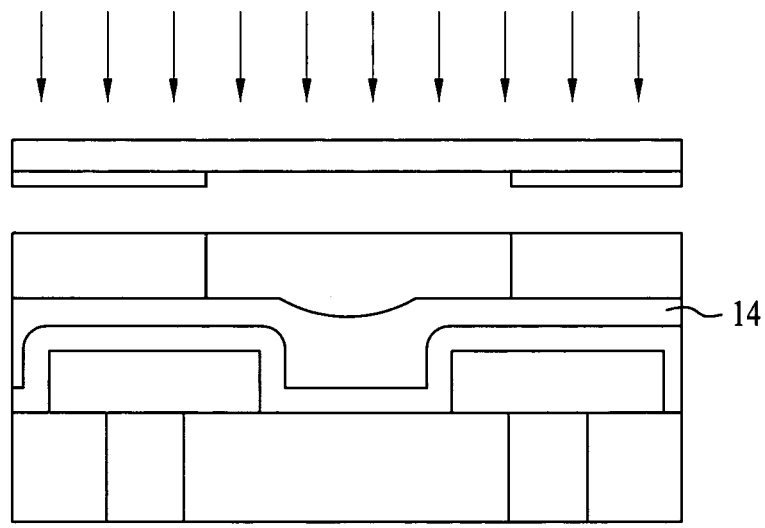

Referring to FIG. 5, the photoresist for inner lens formation undergoes alignment exposure using a mask. The alignment exposure is performed only in a predetermined portion of the photoresist layer, to decompose a photo-active compound contained in the photoresist, whereby transmissivity with respect to visible light wavelengths is improved. A residual ratio is also increased for the predetermined portion. The alignment exposure improves the photoresist layer's tolerance to $O_2$ plasma gas during a dry etching process that increases selectivity with respect to the unexposed portion.

Figure 6:
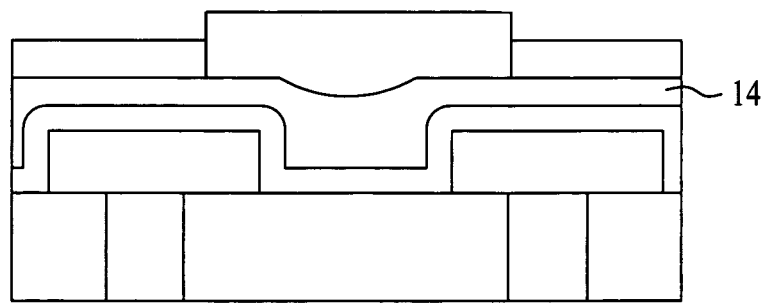

Thereafter, as shown in FIG. 6, the dry etching is performed using the $O_2$ plasma gas under an $N_2$ atmosphere at a process temperature of 120° C. or less, an RF power of approximately 10 to 100 W, and an $O_2$ flow rate of approximately 10 to 50 sccm. The dry etching process removes approximately 50 to 90% of the coated thickness of the inner lens layer, i.e., the photoresist layer.

Figure 7:
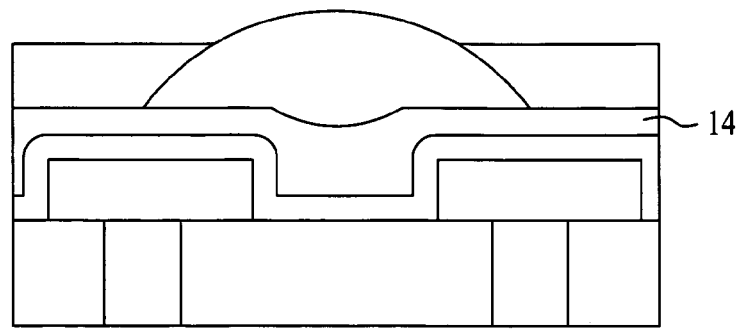

Referring to FIG. 7, thermal energy is applied under an $N_2$ atmosphere, to obtain a predetermined curvature in the etched surface of the photoresist layer. That is, the photoresist layer is heated to a temperature of approximately 150 to 200° C. by a heat treatment process performed under the $N_2$ atmosphere. The inner lens, having the predetermined curvature formed on its upper surface, undergoes silation.

Figure 8:
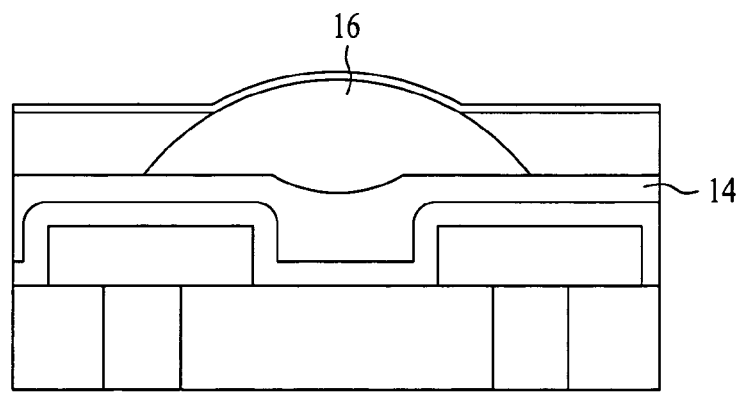

Referring to FIG. 8, a silated inner lens 16 is formed. That is, an oxide layer is formed on the photoresist layer, and the heat-treated inner lens, by a silation process performed in-situ at a temperature of approximately 90 to 150° C. The oxide may be formed by evaporating hexamethyldisilane, tetramethyldisilane, bis(dimethylamino)methylsilane, and other silane gases. The oxide layer is formed during the evaporation of the above silane gases. That is, as the photoresist layer reacts with silicon, an OH radical of a dangling bond forms on the surface of the photoresist layer. The reaction forms the oxide layer. The silation is performed in-situ under an $O_2$ or $O_3$ atmosphere to enable a shallow ashing of the unexposed portion of the inner lens. The dry-etch back process may be omitted. The inner lens thus formed improves the focusing efficiency of the completed image sensor.

Figure 9:
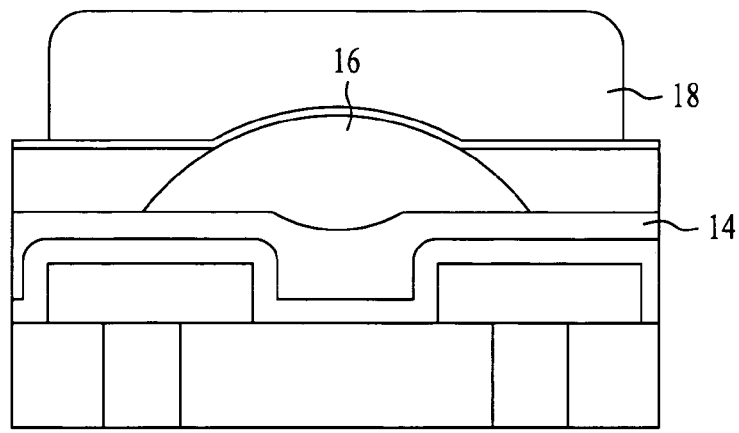

Referring to FIG. 9, a color filter 18 is formed on the silated inner lens 16 to enable a chromatic, or color separation, signal at the photodiodes 12. The color filter 18 is part of a color filter array including different color filters that filter light according to wavelength or color. That is, color, such as the primary colors of red, blue, and green or the complementary colors of cyan, magenta, and yellow, may be filtered. Many other color combinations are possible, including combinations numbering greater than three.

After the color filter portion is formed, an overcoating layer serving as another planarization layer is formed to protect the color filter portion, to control focal length, and to provide a surface for the microlenses, which are disposed to correspond to each pixel. Thus, the image sensor according to the present invention is completed. The color filter portion is formed on the oxide layer when the inner lens is formed to compensate received light. Thus, the process steps are simplified.

In fabricating the color filter portion and the lens for the image sensor, photosensitivity is increased and a phase signal is reduced so as to obtain an image sensor having high resolution and high photosensitivity. Also, the complicated process can be shortened when the inner lens is formed. The planarization layer for the color filter portion may be omitted, facilitating production and enabling reduced costs.

It will be apparent to those skilled in the art that various modifications and variations can be made in the present invention without departing from the spirit or scope of the invention. Thus, it is intended that the present invention cover the modifications and variations provided they come within the scope of the appended claims and their equivalents.

What is claimed is:

1. A method for fabricating an image sensor, comprising:
   forming a photoresist layer on a planarization layer;
   performing an alignment exposure with respect to the photoresist layer;
   performing a dry etching process with respect to the exposed photoresist layer; and
   forming an oxide layer on the etched photoresist layer by silation using a silane gas.

2. The method of claim 1, further comprising:
   performing a heat-treatment process to impart a predetermined curvature to an upper surface of the etched photoresist layer, thereby forming an inner lens.

3. The method of claim 2, wherein the inner lens is heat-treated by a silation process performed in-situ at a temperature of approximately 90 to 150° C.

4. The method of claim 2, further comprising:
   forming a color filter portion that enables a color separation in a transmitted light signal on the inner lens.

5. The method of claim 4, wherein the inner lens is disposed below the color filter portion that enables a color separation in a transmitted light signal.

6. The method of claim 4, wherein the color filter portion is formed after forming the oxide layer.

7. The method of claim 1, wherein the photoresist layer is formed with a predetermined thickness for determining inner lens formation.

8. The method of claim 7, wherein the predetermined thickness of the photoresist layer is approximately 0.5 to 1.5 µm.

9. The method of claim 1, wherein the planarization layer is a passivation layer.

10. The method of claim 1, wherein the dry etching process is performed using $O_2$ plasma gas.

11. The method of claim 1, wherein the dry etching process removes approximately 50 to 90% of the thickness of the photoresist layer.

12. The method of claim 1, wherein the dry etching process is performed under an $N_2$ atmosphere at a process temperature of 120° C. or less, an RF power of approximately 10 to 100 W, and an $O_2$ flow rate of approximately 10 to 50 sccm.

* * * * *